(12) United States Patent
Hesse et al.

(10) Patent No.: US 11,017,554 B2
(45) Date of Patent: May 25, 2021

(54) METHOD FOR SECURING A BONDING PRODUCT IN A WORKING REGION OF A BONDER

(71) Applicant: Hesse GmbH, Paderborn (DE)

(72) Inventors: Hans-Juergen Hesse, Paderborn (DE); Gregor Belting, Paderborn (DE); Markus Riese, Kassel (DE)

(73) Assignee: HESSE GmbH, Paderborn (DE)

( * ) Notice: Subject to any disclaimer, the term of this patent is extended or adjusted under 35 U.S.C. 154(b) by 98 days.

(21) Appl. No.: 16/530,431

(22) Filed: Aug. 2, 2019

(65) Prior Publication Data

US 2019/0355146 A1 Nov. 21, 2019

Related U.S. Application Data

(63) Continuation of application No. PCT/DE2018/100090, filed on Feb. 5, 2018.

(30) Foreign Application Priority Data

Feb. 3, 2017 (DE) ...................... 10 2017 102 182.5
Feb. 6, 2017 (DE) ...................... 10 2017 102 259.7

(51) Int. Cl.
*G06T 7/70* (2017.01)
*H01L 23/00* (2006.01)

(52) U.S. Cl.
CPC ................ *G06T 7/70* (2017.01); *H01L 24/32* (2013.01); *H01L 24/75* (2013.01); *H01L 2224/32245* (2013.01); *H01L 2224/75704* (2013.01)

(58) Field of Classification Search
CPC . G06T 7/70; H01L 24/32; H01L 24/75; H01L 2224/32245; H01L 2224/75704;

(Continued)

(56) References Cited

U.S. PATENT DOCUMENTS 5,549,716 A * 8/1996 Takahashi ............... H01L 24/83
29/25.01
6,141,463 A * 10/2000 Covell ............... G06K 9/00369
345/473

(Continued)

FOREIGN PATENT DOCUMENTS

WO WO-2012092058 A2 * 7/2012 ............... G06T 7/70
WO WO2012092058 A2 7/2012

OTHER PUBLICATIONS

International Search Report dated May 28, 2018 in corresponding application PCT/DE2018/100090.

(Continued)

*Primary Examiner* — Matthew C Bella
*Assistant Examiner* — Kaleb Tessema
(74) *Attorney, Agent, or Firm* — Muncy, Geissler, Olds & Lowe, P.C.

(57) ABSTRACT

A method for securing a bonding product in a working region of a bonder via a clamping device. The bonding product and the clamping device are positioned in the working region of the bonder and a partial characteristic contour is captured to determine the position of the bonding product in the working region. The previously set clamping position of the clamping fingers is captured via a camera and a clamping position is calculated. A current position and orientation of clamping fingers and a new misalignment of the clamping fingers is calculated and displayed until the current position and orientation of the clamping fingers corresponds to a clamping finger reference position.

16 Claims, 7 Drawing Sheets

(58) Field of Classification Search
CPC . H01L 2223/54486; H01L 2224/75753; H01L 2224/75901; H01L 23/544
See application file for complete search history.

(56) References Cited

U.S. PATENT DOCUMENTS

| | | | |
|---|---|---|---|
| 7,067,763 B2* | 6/2006 | Schramm | B23K 26/04 |
| | | | 219/121.69 |
| 9,393,641 B2 | 7/2016 | Byars et al. | |
| 9,925,624 B2 | 3/2018 | Byars et al. | |
| 10,092,984 B2 | 10/2018 | Byars et al. | |
| 2004/0261977 A1 | 12/2004 | Allen et al. | |
| 2012/0024089 A1* | 2/2012 | Couey | H01L 24/78 |
| | | | 73/865.8 |
| 2013/0228611 A1 | 9/2013 | Byars et al. | |

OTHER PUBLICATIONS

International Preliminary Report on Patentability dated Aug. 15, 2019 in corresponding application PCT/DE2018/100090.

* cited by examiner

METHOD FOR SECURING A BONDING PRODUCT IN A WORKING REGION OF A BONDER This nonprovisional application is a continuation of International Application No. PCT/DE2018/100090, which was filed on Feb. 5, 2018, and which claims priority to German Patent Application No. 10 2017 102 182.5, which was filed in Germany on Feb. 3, 2017, and German Patent Application No. 10 2017 102 259.7, which was filed in Germany on Feb. 6, 2017 which are all herein incorporated by reference.

BACKGROUND OF THE INVENTION

Field of the Invention

The invention relates to a method for securing a bonding product in a working region of a bonder via a clamping device. The clamping device provides a plurality of clamping fingers which must be positioned correctly in order to properly perform the bonding process.

Description of the Background Art

It is known from U.S. Pat. No. 9,393,641 to capture a live image of the clamping device or a subregion thereof by means of a camera and to display it on a screen. In addition to the live image of the camera, a reference position for the clamping device is displayed on the screen using graphic elements. The graphic elements are placed directly on the live image of the camera in the form of an overlay. When the machines are being set up and, in particular, during the positioning of the clamping device, the machine operator can correct the position of the latter until the clamping device is disposed in the reference position.

SUMMARY OF THE INVENTION

It is therefore an object of the present invention to provide an improved method of positioning the clamping device for the bonding product, in which the machine operator is additionally assisted and the set up process is further simplified.

In an exemplary embodiment, the method according to the invention comprises an initialization routine and a takeover routine to be repeatedly executed after the initialization routine has been completed. During the initialization routine, the clamping device can be first set up for a specific bonding product by a highly experienced machine operator or another person skilled in the art. In this respect, the bonding product and the clamping device are positioned in the working region of the bonder. Bonding product reference markings provided on the bonding product are captured and stored by means of a camera of the bonder. Based on the position of the bonding product reference markings, the position and/or orientation of the bonding product relative to the bonder are determined. Furthermore, clamping fingers of the clamping device are thus brought into a clamping position and clamping surfaces disposed on the clamping fingers of the clamping device are applied against the bonding product in such a manner that in a subsequent step, a connection contact can be established on predetermined connection surfaces of the bonding product without the bonding product being unduly excited to vibrate and/or a collision occurring with the clamping device during displacement or positioning of a bonding tool of the bonder. The clamping position of the clamping fingers is then captured by means of the camera, and the clamping position is calculated and stored relative to the position and/or orientation of the bonding product as a clamping finger reference position.

After the first-time set up of the clamping device, the clamping finger reference position is known. In the context of the takeover routine in a repeated processing of the same bonding product, therefore, the known clamping finger reference position can be assumed, and the positioning of the clamping device can be easily performed with the aid of a computer. For example, a machine operator can position the bonding product and the clamping device with the clamping fingers in the working region of the bonder and capture the current position and orientation of the bonding product and the clamping device by means of the camera. On the basis of the current position and orientation of the bonding product and the clamping device, and based on the stored clamping finger reference position, an initial misalignment of the clamping fingers is calculated and displayed. Iteratively, the current position and/or orientation of the clamping fingers is then corrected and re-captured by the camera and a new misalignment of the clamping fingers is calculated and displayed until the position and orientation of the clamping fingers corresponds to the clamping finger reference position. It is sufficient in this case if the clamping fingers are disposed in a permissible tolerance range. What is essential is that the subsequent steps can be carried out reliably and that in particular there is no undue vibration excitation of the bonding product and that the bonding tool held on a bond head of the bonder can be moved and positioned without colliding.

An advantage of the invention is that, first of all, a particularly advantageous reference position is determined for the clamping device. The reference position is stored and subsequently used to later reposition the clamping device for the same bonding product. In this case, by means of the method according to the invention, the machine operator is particularly supported in that the misalignment is calculated and displayed. In this respect, the machine operator is precisely informed of the current position or orientation of the clamping device. In addition, the misalignment is displayed so that he is very quickly able to recognize the extent of the correction needed and is able to carry out the positioning reliably and correctly in a short time.

The same camera system can be used to set up and position the clamping device, which conventional bonders have, for example, for detecting the position and/or orientation of a chip. By means of image analysis routines, these camera systems can very precisely determine the position of the connection surfaces on the chip. In the context of the present inventive method, the position and/or orientation of the bonding product or the clamping fingers is captured by means of such image analysis routines.

The clamping device may provide, for example, the plurality of clamping fingers and a clamping plate, which serves to place the clamping device on a working surface of the bonder and to support the clamping fingers. The clamping device may be formed in one piece or have a positionally fixed association of the clamping fingers to the clamping plate. For example, the clamping device may be formed in several parts with the ability to move each individual clamping finger individually relative to the other and to the clamping plate or to adjust a group of clamping fingers relative to the clamping plate and the other clamping fingers.

When carrying out the method according to the invention, for example, initially only the bonding product can be positioned in the working region of the bonder. Before the clamping device is also positioned in the working region of the bonder, first the bonding product reference markings are determined. After the bonding product reference markings are determined and the clamping device is positioned in the working region, then the entire clamping device or the individual clamping fingers are aligned and placed against the bonding product in such a way that subsequently, the bonding process can be performed correctly. Advantageously, the detection of the bonding product reference markings is easy when the clamping device is not yet positioned in the working region since an overlap can be avoided. Alternatively, it can be provided to initially position the bonding product and the clamping device in the working region and to then capture the reference markings.

The current position and/or orientation of the clamping fingers and/or the clamping finger reference position can be determined by the camera, in that a positioning marking (clamping finger positioning marking) provided on the clamping fingers and/or—at least in sections—a contour of the clamping fingers is captured and stored as a clamping finger reference marking. Advantageously, by capturing the clamping finger positioning marking and/or by means of the at least partial contour detection, the position and orientation of the clamping fingers can be determined quickly and reliably.

The camera can be positioned and/or moved manually above the bonding product reference markings and/or the clamping finger reference markings to determine the bonding product reference markings and/or the clamping finger reference position and/or the clamping finger reference markings. By positioning the camera above the reference markings, the accuracy of the method and in particular the accuracy of the image processing are further improved. In addition, the method according to the invention can be operated particularly intuitively when the camera is moved manually. Alternatively, the camera can be moved automatically.

For example, in the context of the initialization routine, the camera can be moved manually, and in the context of the takeover routine, it can be moved automatically.

A reference image can be captured and stored in the initialization phase by the camera after the clamping fingers are disposed in the clamping finger reference position. Advantageously, by providing the reference image, the machine operator is further supported, in particular during the takeover routine, since he can optically detect the reference position and thus bring the clamping fingers at least approximately into the intended position.

The positioning of the clamping fingers in particular in the takeover routine can be further simplified if clamping markings are provided on the bonding product at the points at which the clamping surfaces of the clamping fingers are to be positioned. Just like the bonding product positioning markings and/or the clamping finger positioning markings, the clamping markings may also be disposed, for example, on the bonding product or the clamping fingers during the manufacturing process of the bonding product or in the manufacture of the clamping device. As long as a one-piece clamping device is provided in which the clamping fingers cannot be adjusted relative to the clamping plate, the clamping finger positioning markings can also be disposed on the clamping plate.

In the takeover routine, a live image of the camera or the reference image and/or a reference representation of the clamping finger reference position on the one hand and, locally separated therefrom, the misalignment of the clamping fingers on the other hand, can be shown. The overlay of positioning markings, contours or other adjustment aids in the live image is omitted in the context of the invention. For example, an excerpt from a CAD drawing or another suitable graphic model of the clamping device or the clamping finger serves as a reference illustration.

According to a development of the invention, in a clamping device which has at least individual clamping fingers that are adjustable relative to the clamping plate, the adjustable clamping fingers are sequentially positioned or adjusted. The order in which the clamping fingers are adjusted, for example, can be selected manually by the machine operator.

According to a development of the invention, the misalignment of the clamping fingers can be visualized in that on the one hand the current position and/or orientation of the clamping fingers is displayed, and separately therefrom the clamping finger reference position is shown, and/or in that a displacement direction is displayed into which the clamping fingers must be moved or pivoted to bring them into the clamping finger reference position. For example, the misalignment can be calculated and displayed relative to the clamping finger reference position. Advantageously, the correct positioning of the clamping fingers is further simplified by the above-described means for visualizing the misalignment. In particular, the extent of the misalignment can be represented or captured numerically, and the setup process can be significantly accelerated by the identified displacement direction.

According to a development of the invention, the misalignment is visualized in that the clamping finger reference position and the current position or orientation of the clamping fingers are added and displayed as a summation image. Advantageously, the summation image provides the machine operator with an optical gage for the misalignment. If in the summation image ultimately only the geometry of the clamping finger itself is displayed, then the clamping finger is in the clamping finger reference position. In this case, for example, the summation image can be displayed in a different color. If the misalignment is inadmissibly great, the total image can be displayed, for example, in red. As soon as the clamping finger is adequately precisely positioned, the summation image can be shown in green. Thus, the machine operator is further assisted.

According to a development of the invention, a difference image can be displayed for visualization of the misalignment, which results from subtracting the clamping finger reference position from the current position and/or orientation of the clamping fingers. Analogous to the realization of the summation image representation, the difference image can also be designed to be variably colored, for example with the proviso that the difference image is displayed green if the clamping finger is sufficient exactly positioned, and that the difference image is displayed in red when the deviation from the clamping finger reference position is impermissibly great.

According to a development of the invention, individual or all connection contacts for the bonding product can be manufactured in the context of the initialization routine prior to storing the clamping finger reference position. Advantageously, doing so can ensure that harmful vibrations and collisions are avoided.

According to a development of the invention, the bonding product is positioned by means of a conveyor device in the working region of the bonder. By providing a conveyor device, in particular a conveyor device customary in bonding or semiconductor technology, the bonding product can be repositioned in the working region of the bonder with such accuracy that the clamping device is positioned with very little effort and that in particular during the processing of a large quantity of the same bonding products, there is no need for readjustment.

According to a development of the invention, a mounting point on the bonding product disposed for bearing against the contact surface of the clamping device is marked by means of a laser as part of the takeover routine. Advantageously, the adjustment of the clamping device is further simplified by marking the mounting point.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
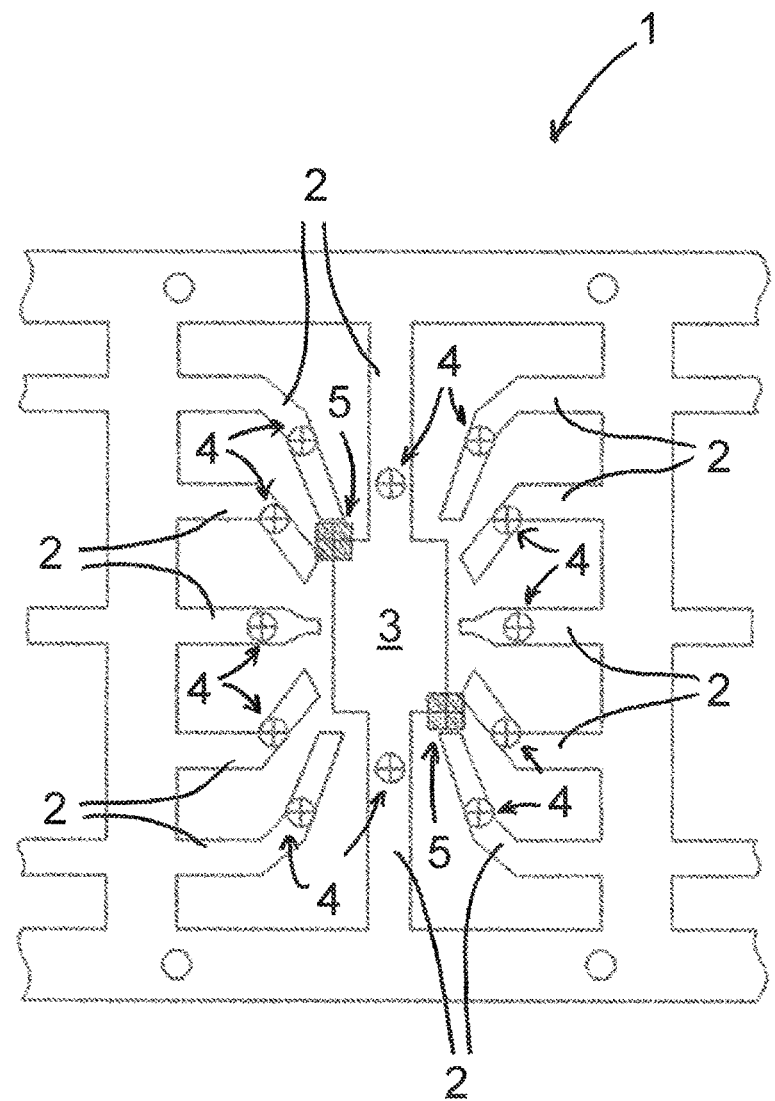
FIG. 1 is a top view of a bonding product in a partial representation.

FIG. 1 shows a bonding product 1 by way of example with a total of twelve webs 2 and a contact surface 3 for a chip, which is to be electrically connected to the bonding product 1. Each web 2 is also assigned clamping markings 4. Lastly, two bonding product reference markings 5 are shown, which are formed by a characteristic contour of the bonding product 1 in the area of the contact surface 3.

Figure 2:
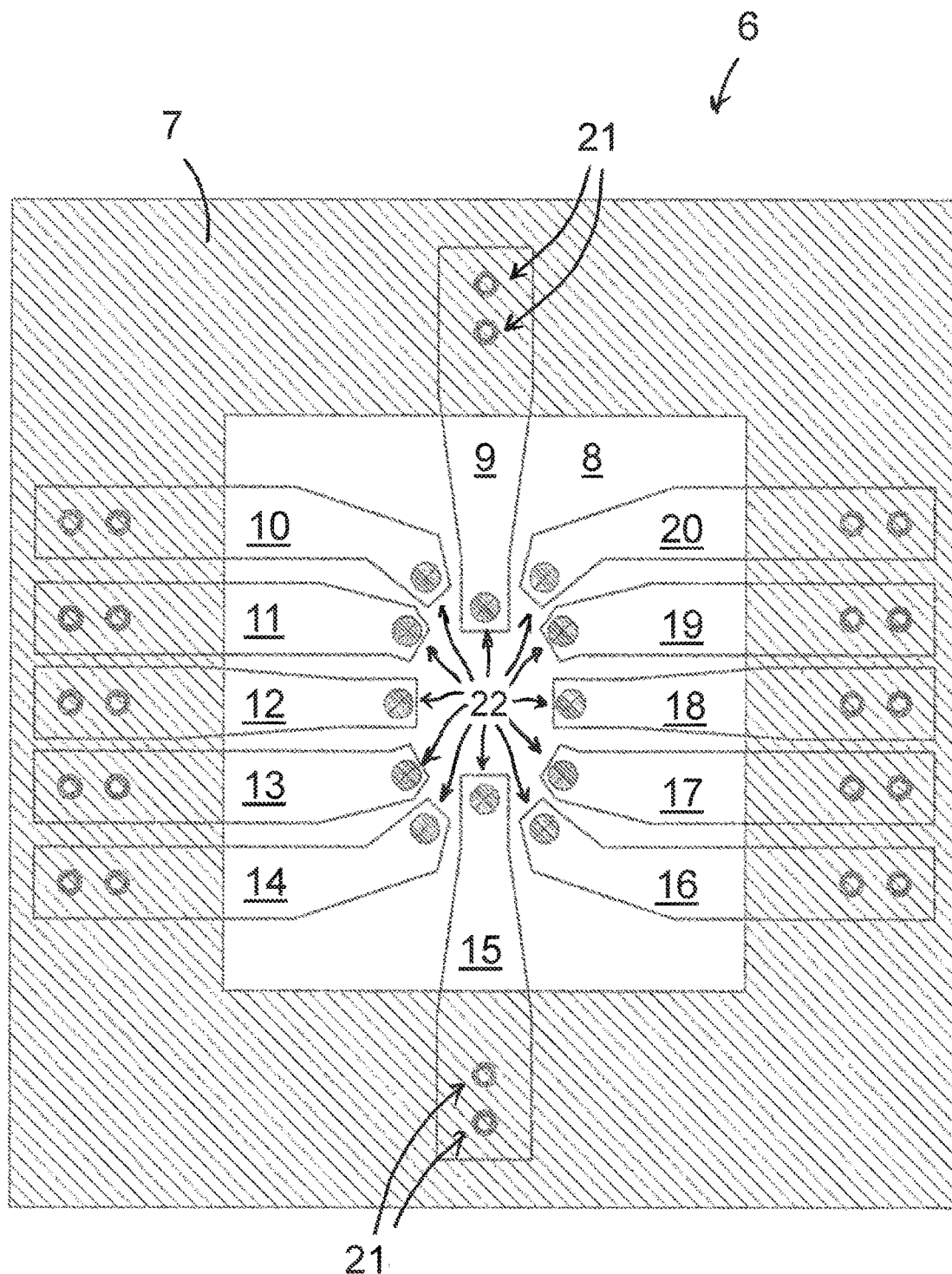
FIG. 2 is a schematic diagram of a clamping device with a base plate and a total of twelve clamping fingers that are displaceable relative to the base plate.

FIG. 2 shows a clamping device 6 with a clamping plate 7, which has a central recess 8 for the bonding product 1. Furthermore, a total of twelve clamping fingers 9, 10, 11, 12, 13, 14, 15, 16, 17, 18, 19, 20 are provided. The clamping fingers 9, 10, 11, 12, 13, 14, 15, 16, 17, 18, 19, 20 are each secured by two screws 21 on the clamping plate 7. Since the screws 21 have play in order to function, the clamping device 6 as a whole can on the one hand be adjusted or positioned by turning the clamping plate 7. On the other hand, the individual clamping fingers 9, 10, 11, 12, 13, 14, 15, 16, 17, 18, 19, 20 can be positioned within the play range, relative to the clamping plate 7.

In each case, a clamping finger reference marker 22 is disposed on the clamping fingers 9, 10, 11, 12, 13, 14, 15, 16, 17, 18, 19, 20. In this case, the clamping finger reference marker 22 is formed by way of example by a positioning marking of the clamping finger, which has the shape of a cross provided in a circle.

Figure 3:
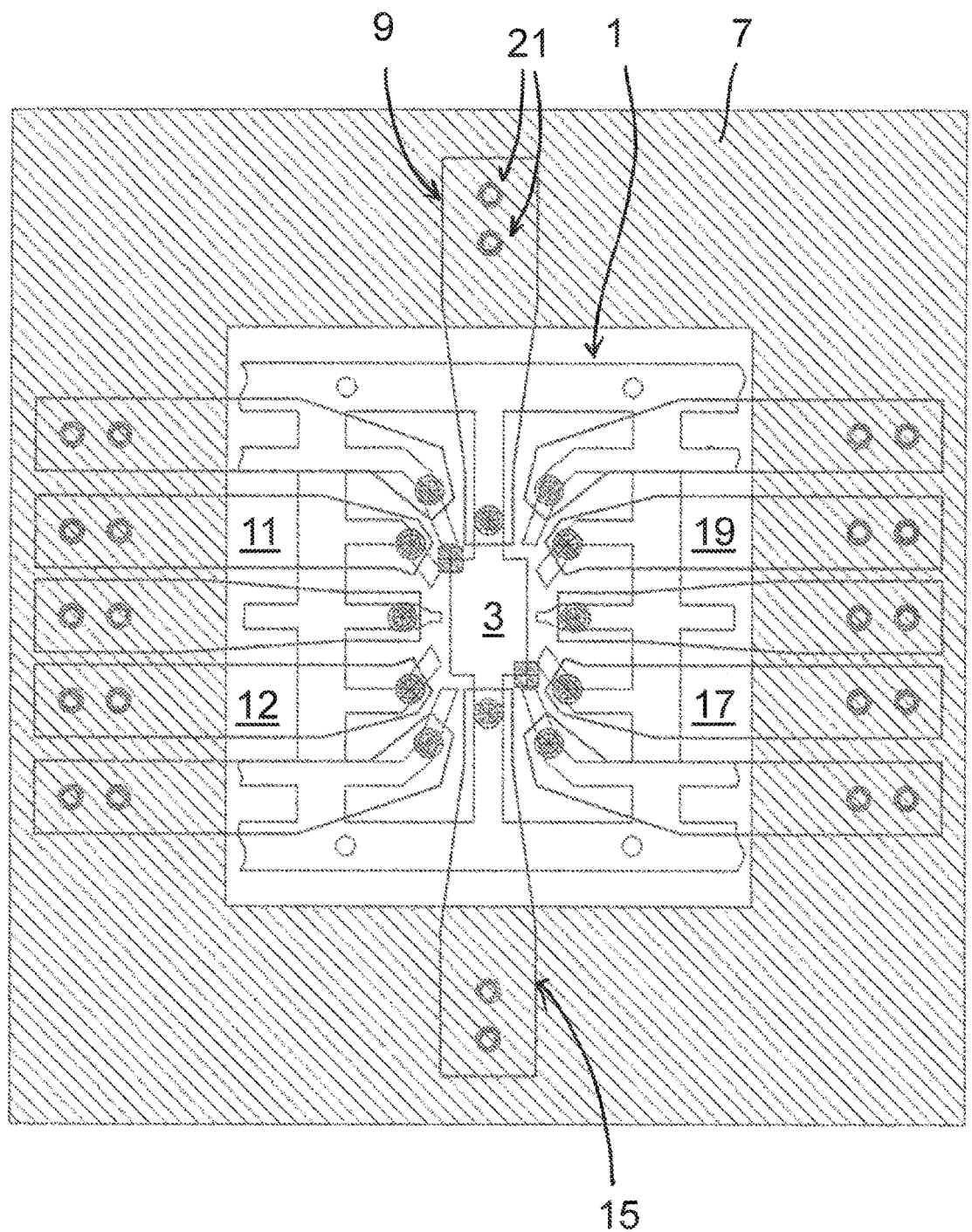
FIG. 3 is a schematic representation of a clamping situation in which the bonding product according to FIG. 1 is fixed via the clamping device according to FIG. 2.

FIG. 3 shows the clamping device 6 with the bonding product 1 according to FIG. 1 provided in the recess 8. As in FIG. 2, the representation is shown only schematically so as to identify the assignment in such a manner that invisible lines are shown to illustrate the positioning of the bonding product 1 on the one hand, on the other hand of the clamping device 6, or for the assignment to the clamping fingers 9, 10, 11, 12, 13, 14, 15, 16, 17, 18, 19, 20 on the one hand, on the other hand to the webs 2 of the bonding product 1. In particular, the assignment is provided such that in the present exemplary embodiment of the invention, the clamping finger reference markers 22 provided on the clamping fingers 9, 10, 11, 12, 13, 14, 15, 16, 17, 18, 19, 20 are disposed just above the bonding product reference markers 5, which are disposed on the webs 2 of the bonding product 1.

In the present example, the clamping fingers 9, 10, 11, 12, 13, 14, 15, 16, 17, 18, 19, 20 of the clamping device 6 are assigned to the bonding product 1 such that by means of a suitable handling device, the chip can be placed on the contact surface 3 of the bonding product 1, and then electrically conductive bond connections can be established between the chip on the one hand and the bonding product 1 on the other hand. In this respect, in particular the position of the clamping fingers 9, 10, 11, 12, 13, 14, 15, 16, 17, 18, 19, 20 relative to the orientation and design of the bonding product 1 is chosen such that the bonding product 1 is not unduly excited to vibrate during the bonding process and in particular does not oscillate in a natural mode, and that an unillustrated bonding tool of the bonder, which is usually held on a bond head that is movable and rotatable in three Cartesian coordinates, can be displaced and moved without colliding.

Figure 4:
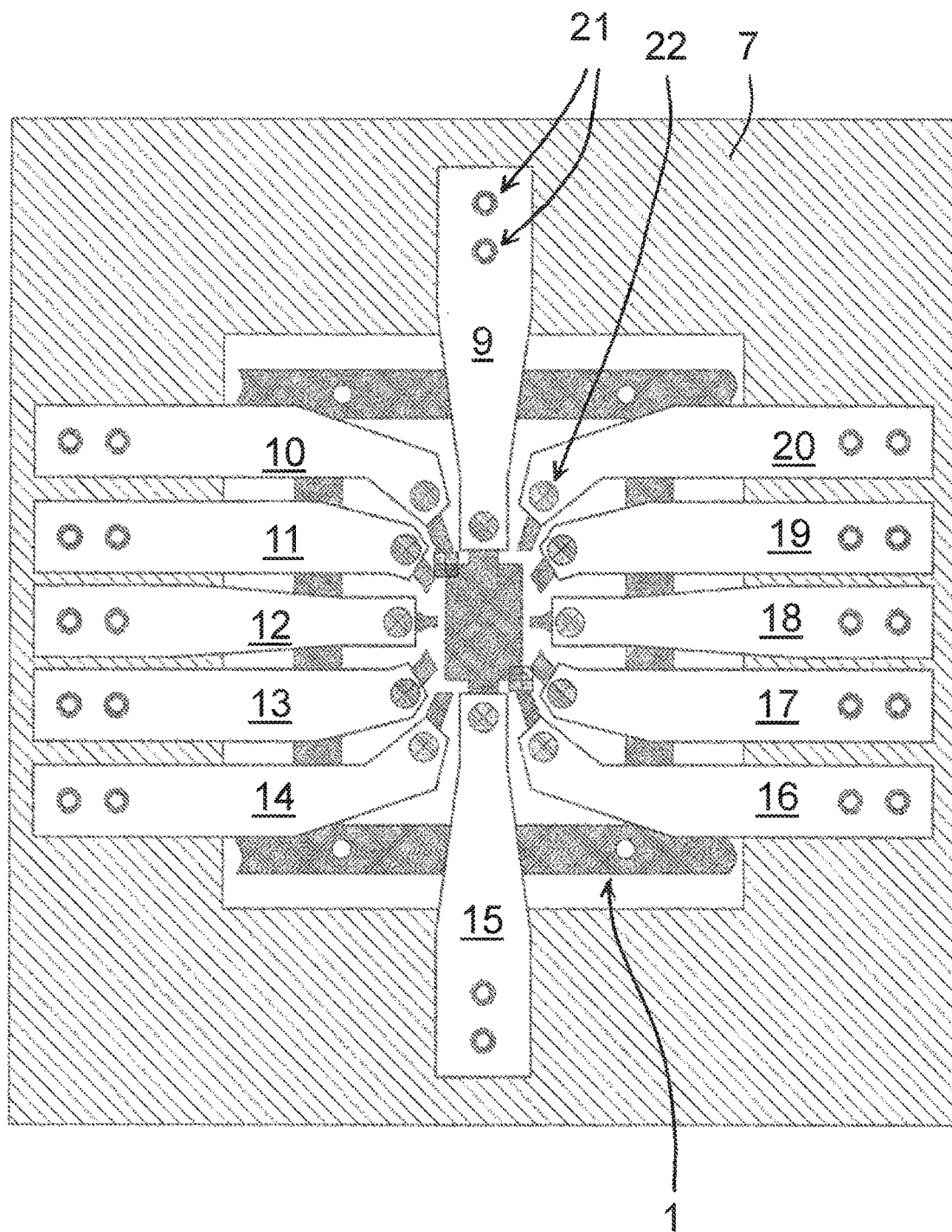
FIG. 4 illustrates a representation according to FIG. 3 in a plan view, wherein contours that are not visible are omitted.

FIG. 4 shows an analogous representation of the bonding arrangement according to FIG. 3. In this case, covered edges of the clamping plate 7 and of the bonding product 1 are not shown, unlike in FIG. 3.

In order to position the clamping fingers 9, 10, 11, 12, 13, 14, 15, 16, 17, 18, 19, 20 of the clamping plate 7 relative to the bonding product 1, initially a suitable clamping configuration is determined in an initialization routine by a particularly experienced employee. For example, at least individual connection contacts and preferably all connection contacts for the bonding product 1 are established for purposes of verification. In this way it can be examined whether the bonding product 1 is unduly excited to vibrate, i.e. can be bonded in a collision-free manner. As long as the clamping configuration meets the requirements of the bonding process, it is stored as the clamping finger reference position. Capture takes place by means of a camera and downstream image processing routines.

In the exemplary embodiment of the invention according to FIGS. 1 to 4, in particular the clamping finger reference markings 22 are captured to determine the position and/or orientation of the clamping fingers 9, 10, 11, 12, 13, 14, 15, 16, 17, 18, 19, 20. Capturing a single point per clamping finger 9, 10, 11, 12, 13, 14, 15, 16, 17, 18, 19, 20 is sufficient in this connection since by virtue of securing the clamping fingers 9, 10, 11, 12, 13, 14, 15, 16, 17, 18, 19, 20 with the screws 21, ultimately only a slight rotational or linear displacement of the clamping fingers 9, 10, 11, 12, 13, 14, 15, 16, 17, 18, 19, 20 can be provided with the result that the position of the clamping fingers 9, 10, 11, 12, 13, 14, 15, 16, 17, 18, 19, 20 is determined sufficiently accurately per clamping finger by a single clamping finger reference marker 22.

Of course, in another embodiment of the clamping device it may be necessary to optically capture more than one clamping finger positioning marker per clamping finger so as to then determine the position and orientation of the clamping fingers with sufficient accuracy. What is instrumental here is in particular the way the clamping finger is secured to the clamping plate of the clamping device.

Figure 5:
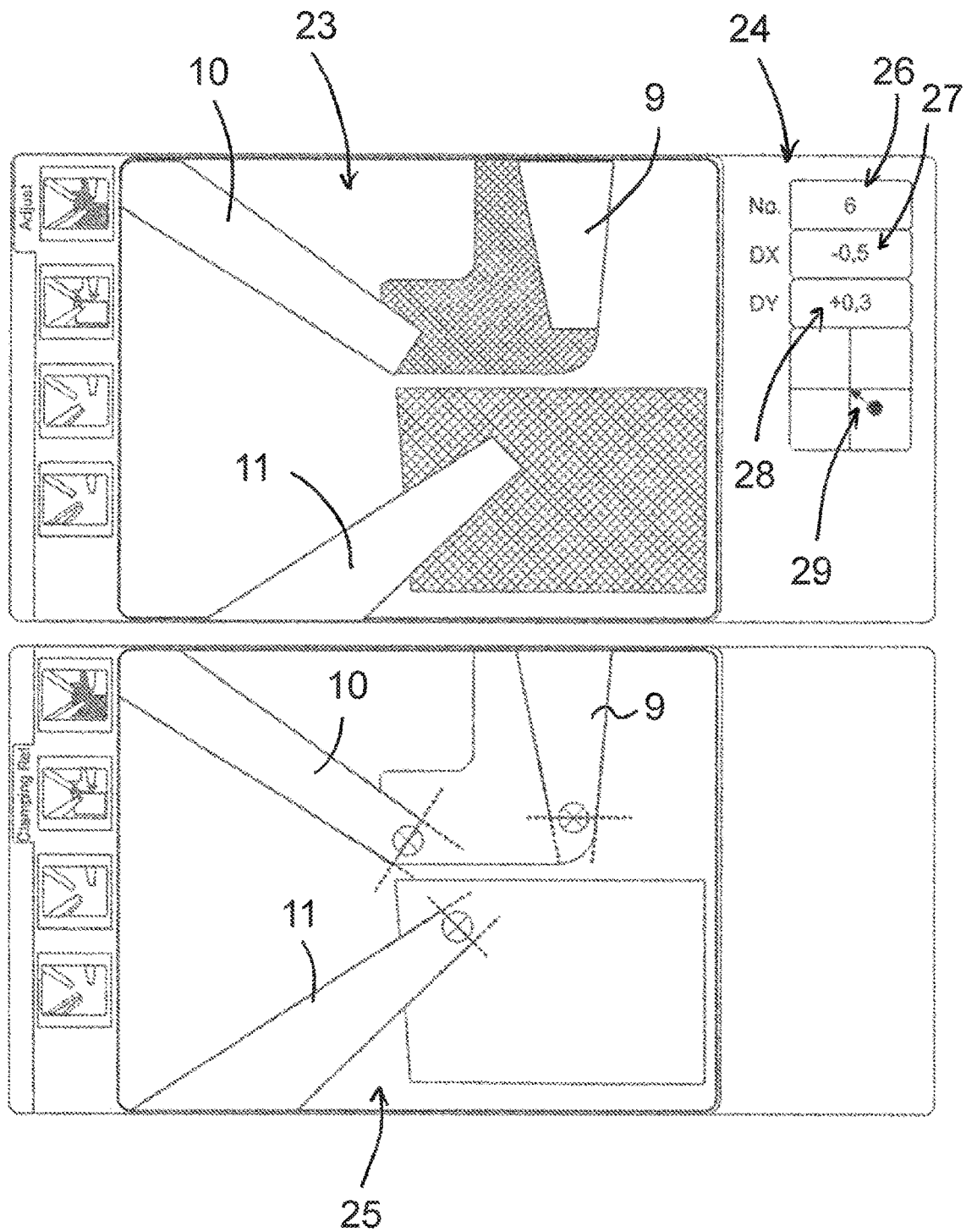
FIG. 5 shows a first example of a representation of a misalignment of three clamping fingers of the clamping device.

If the clamping finger reference position is known, the correct positioning of the clamping device in the subsequent takeover routine can in particular be graphically supported. To this end, FIG. 5 shows a first example. FIG. 5 shows a multi-part display element of a bonder. In an upper image segment, on the one hand in a first screen section 23, a reference image is displayed which represents the clamping finger reference position for three clamping fingers 9, 10, 11. For example, the reference image was captured by means of the camera. In a second screen section 24 of the upper image segment, which is located to the right of the first screen section 23, on the one hand a misalignment for a third clamping finger 11 is shown, which is shown in the first screen section 23. For clarification of the misalignment, on the one hand a deviation value 27 in an X-direction and, on the other, a deviation value 28 in a Y-direction are displayed as numerical values. In addition, a displacement direction 29 for the third clamping finger 11 is displayed. The machine operator can therefore use the information in the second screen section 24 to very quickly capture the misalignment numerically and directionally and thus promptly position the clamping device 6 correctly. Furthermore, an identification number 26 is provided for the clamping finger 11 currently being adjusted.

Further, in a third screen section 25 (lower picture segment), the current position and orientation of the three clamping fingers 9, 10, 11 is shown. A comparison of the representation in the first screen section 23 and in the third screen section 25 allows for the machine operator to quickly detect and correct the misalignment.

Figure 6:
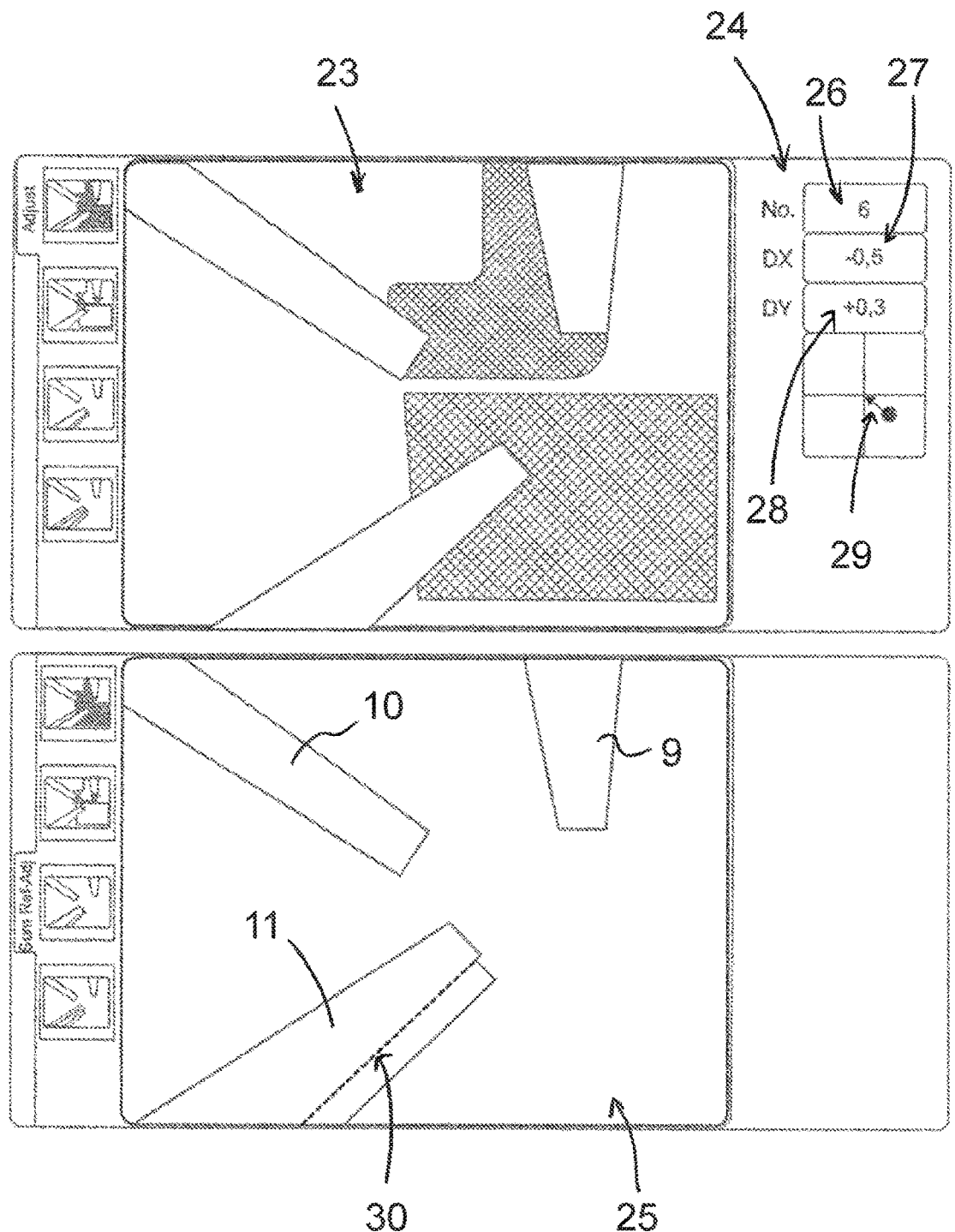
FIG. 6 shows a second example of the representation of the misalignment of the three clamping fingers.

An alternative visualization of the misalignment is shown in FIG. 6. While the same information or image contents are displayed in the first screen section 23 and in the second screen section 24, a summation image for the third clamping finger 11 is shown in the third screen section 25. In the summation image, the clamping finger reference position for the third clamping finger 11 and the current position and orientation of the third clamping finger 11 are added up with the result that the third clamping finger 11 is shown larger, i.e. wider, if the clamping finger reference position is not set correctly. Thus, only an overlap area is colored, i.e. represented.

Figure 7:
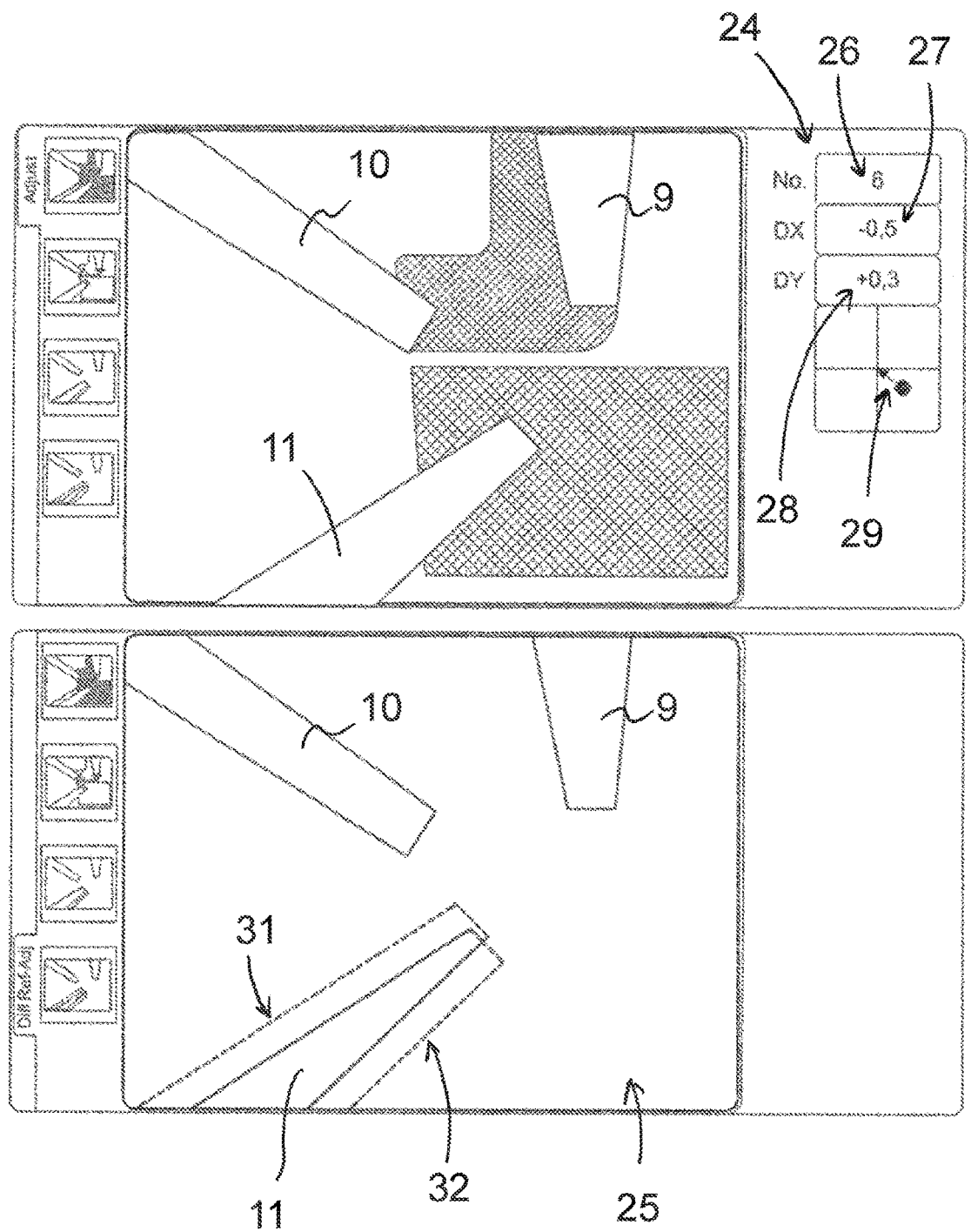
FIG. 7 shows a third example of the representation of the misalignment of the three clamping fingers.

Analogously in FIG. 7, a difference image representation is chosen for the third clamping finger 11. In the difference image representation, the clamping finger reference position and the current position and orientation of the third clamping finger 11 are subtracted with the result that the third clamping finger 11 in the illustration of FIG. 7 appears slimmer than it is in reality, as long as the clamping finger reference position is not set correctly.

In each case, the clamping finger contours 30, 31, 32 are shown in dashed lines in FIGS. 6 and 7 for purposes of guidance only, which indicate the geometry of the third clamping finger 11 in the clamping finger reference position or the current position. The clamping finger contour lines 30, 31, 32 are not visible in the actual representation. They are only shown here to clarify the visualization and to explain the principle underlying the summation image and the difference image.

The invention being thus described, it will be obvious that the same may be varied in many ways. Such variations are not to be regarded as a departure from the spirit and scope of the invention, and all such modifications as would be obvious to one skilled in the art are to be included within the scope of the following claims

What is claimed is:

1. A method for securing a bonding product in a working region of a bonder via a clamping device, the method comprising:
   an initialization routine comprising:
      positioning the bonding product and the clamping device in the working region of the bonder;
      capturing a partial characteristic contour of the bonding product to determine the position of the bonding product in the working region by capturing, via a camera, bonding product positioning markings disposed on the bonding product and storing the bonding product positioning markings as bonding product reference markings;
      determining a position and/or an orientation of the bonding product relative to the bonder based on the bonding product reference markings;
      bringing clamping fingers of the clamping device into a clamping position;
      bringing clamping surfaces disposed on the clamping fingers of the clamping device to bear against predetermined contact surfaces of the bonding product such that a connection contact is established without the bonding product being unduly excited to vibrate and/or without there being any collisions with the clamping device during displacement and/or positioning of a bonding tool of the bonder;
      capturing the previously set clamping position of the clamping fingers via the camera; and
      calculating the clamping position relative to the position and/or orientation of the bonding product to determine a clamping finger reference position and storing the clamping finger reference position; and
   a takeover routine comprising:
      positioning the bonding product and the clamping device with the clamping fingers in the working region of the bonder;
      capturing a current position and orientation of the bonding product and the clamping device by the camera;
      calculating and displaying, based on the current position and orientation of the bonding product and the clamping device and based on the stored clamping finger reference position, an initial misalignment of the clamping fingers; and
      correcting and re-capturing, iteratively, the current position and orientation of the clamping fingers and calculating and displaying a new misalignment of the clamping fingers until the current position and orientation of the clamping fingers corresponds to the clamping finger reference position.

2. The method according to claim 1, wherein the clamping fingers of the clamping device, which are relatively movable to one another, are individually positioned and/or fixed and/or wherein the clamping finger reference position for each clamping finger is individually captured and/or that the position and/or orientation of the individual clamping fingers is individually corrected.

3. The method according to claim 1, wherein, for determining the current position and/or orientation of the clamping fingers and/or the clamping finger reference position, a clamping finger positioning marking and/or a partial contour of the clamping fingers are captured as a clamping finger reference marking via the camera.

4. The method according to claim 1, wherein, for capturing the bonding product reference markings and/or for capturing the clamping finger reference position of the clamping fingers, the camera is moved manually and/or positioned above the bonding product reference markings and/or the clamping finger reference markings.

5. The method according to claim 1, wherein, in the initialization phase, a reference image is capturing via the camera and stored when the clamping fingers are disposed in the clamping finger reference position.

6. The method according to claim 1, wherein, in the takeover routine, a live image of the camera or the reference image and/or a reference representation and, locally separated therefrom, a misalignment of the clamping fingers are displayed.

7. The method according to claim 1, wherein, for the visualization of the initial misalignment and the new misalignment, the current position and/or orientation of the clamping fingers and/or the clamping finger reference position are displayed.

8. The method according to claim 1, wherein, for the visualization of the initial misalignment and the new misalignment, the clamping finger reference position and the current position and/or orientation of the clamping fingers are added and displayed as a summation image, such that in the visualization, a misaligned clamping finger is displayed as larger than a non-misaligned clamping finger.

9. The method according to claim 1, wherein, for visualization of the initial misalignment and the new misalignment, the clamping finger reference position and the current position and orientation of the clamping fingers are subtracted and displayed as a difference image, such that in the visualization, a misaligned clamping finger is displayed as smaller than a non-misaligned clamping finger.

10. The method according to claim 1, wherein the initial misalignment and the new misalignment are calculated relative to the clamping finger reference position and are displayed as a numerical value and wherein a displacement direction for the clamping fingers is shown.

11. The method according to claim 1, wherein, in the context of the initialization routine, before storing the clamping finger reference position, at least one connection contact or all connection contacts are established on the bonding product.

12. The method according to claim 1, wherein the bonding product is fed via a conveying device into the working region of the bonder.

13. The method according to claim 1, wherein the bonding product is pressed from below against the contact surfaces of the clamping device.

14. The method according to claim 1, wherein, in the takeover routine, a mounting point provided for bearing against the contact surface of the clamping device is marked on the bonding product via a laser if no clamping marking is provided on the bonding product.

15. The method according to claim 10, wherein the numerical value of the initial misalignment and the new misalignment that is displayed includes a deviation value in the x-direction and a deviation value in the y-direction, and wherein the displacement direction for the clamping fingers specifies a direction in which a misaligned clamping finger is to be moved.

16. The method according to claim 1, wherein the displaying of the initial misalignment and the new misalignment of the clamping fingers includes a display having three separate display sections including a first screen section, a second screen section and a third screen section,
- wherein the first screen section depicts the clamping finger reference position, such that a reference image is depicted in the first screen section,
- wherein the third screen section depicts the current position and orientation of the bonding product and the clamping device, such that a current image is depicted in the third screen section, and
- wherein the second screen section depicts numerical values of the initial misalignment and thereafter, numerical values of the new misalignment, the numerical values including a deviation value in the x-direction and a deviation value in the y-direction.

* * * * *